United States Patent
Beer et al.

(10) Patent No.: US 6,891,431 B2
(45) Date of Patent: May 10, 2005

(54) INTEGRATED SEMICONDUCTOR CIRCUIT CONFIGURATION

(75) Inventors: Peter Beer, Tutzing (DE); Carsten Ohlhoff, München (DE)

(73) Assignee: Infineon Technologies AG, Munich (DE)

(*) Notice: Subject to any disclaimer, the term of this patent is extended or adjusted under 35 U.S.C. 154(b) by 33 days.

(21) Appl. No.: 10/675,761

(22) Filed: Sep. 30, 2003

(65) Prior Publication Data
US 2004/0066209 A1 Apr. 8, 2004

(30) Foreign Application Priority Data
Sep. 30, 2002 (DE) .......................................... 102 45 551

(51) Int. Cl.[7] .......................... H03F 15/00; G01R 31/26
(52) U.S. Cl. ........................ 330/6; 324/765; 324/117 H
(58) Field of Search .............................. 330/6; 324/765, 324/117 H

(56) References Cited

U.S. PATENT DOCUMENTS

| | | | |
|---|---|---|---|
| 5,399,965 A | * | 3/1995 | Heberle .................. 324/117 H |
| 6,310,470 B1 | | 10/2001 | Hebing et al. |
| 6,518,782 B1 | * | 2/2003 | Turner ......................... 324/760 |
| 6,583,613 B1 | | 6/2003 | Hohe et al. |
| 6,744,250 B2 | * | 6/2004 | Hauenstein ................. 324/252 |
| 2004/0027891 A1 | * | 2/2004 | Hartmann .................... 365/202 |

FOREIGN PATENT DOCUMENTS

| | | |
|---|---|---|
| DE | 197 05 767 C2 | 8/1998 |
| DE | 197 48 550 A1 | 10/1998 |
| DE | 198 38 536 A1 | 3/2000 |
| DE | 199 10 801 A1 | 10/2000 |
| DE | 101 00 598 A1 | 7/2002 |
| DE | 101 00 884 A1 | 7/2002 |
| JP | 04018777 A | 1/1992 |

* cited by examiner

Primary Examiner—Patricia Nguyen
(74) Attorney, Agent, or Firm—Laurence A. Greenberg; Werner H. Stemer; Ralph E. Locher

(57) ABSTRACT

To measure the current consumption of a circuit device with a current measuring device, the circuit device being supplied by a current/voltage supply line device, as simply as possible without the need for additional measuring devices, an integrated circuit configuration includes integrating the circuit configuration, the current measuring device, and, also, the current/voltage supply line device in a common chip and forming the current measuring device with a Hall sensor device.

21 Claims, 2 Drawing Sheets

INTEGRATED SEMICONDUCTOR CIRCUIT CONFIGURATION

BACKGROUND OF THE INVENTION

Field of the Invention

The present invention relates to an integrated semiconductor circuit configuration.

In the development and production of semiconductor configurations, for example, memory devices, memory chips, wafers, and semiconductor modules, it is necessary to test the semiconductor devices during the development process or, else, during various intermediate stages of production to guarantee the functioning of the semiconductor devices and to be able to ensure quality assurance. In such a case, in addition to various functional parameters, if appropriate, the electrical power consumption or the like is also determined individually for the individual semiconductor devices.

The influence of the test process on the test result itself and also the outlay in respect of time and apparatus for such tests are problematic in the case of such functional tests that determine the parameters of the electrical power consumption.

SUMMARY OF THE INVENTION

It is accordingly an object of the invention to provide an integrated semiconductor circuit configuration that overcomes the hereinafore-mentioned disadvantages of the heretofore-known devices of this general type and with which operating parameters that relate to the electrical current consumption can be determined individually and, nevertheless, particularly flexibly and reliably without a high outlay.

With the foregoing and other objects in view, there is provided, in accordance with the invention, an integrated semiconductor circuit configuration, including at least one of a semiconductor material region and a chip, a circuit device having a current consumption, a current/voltage supply line device connected to the circuit device, a current measuring device connected to the current/voltage supply line device for measuring the current consumption of the circuit device through the current/voltage supply line device, the current measuring device having at least one Hall sensor device, and the circuit device, the current measuring device, and at least part of the current/voltage supply line device being commonly integrated in the at least one of the semiconductor material region and the chip.

With the objects of the invention in view, there is also provided an integrated semiconductor circuit configuration, including at least one of a semiconductor material region and a chip, a current/voltage supply line device having a current consumption, a current measuring device being connected to the current/voltage supply line device and having at least one Hall sensor device for measuring the current consumption through the current/voltage supply line device, a circuit device connected to the current/voltage supply line device and supplied at least one of current and voltage through the current/voltage supply line device, and the circuit device, the current measuring device and at least part of the current/voltage supply line device being commonly integrated in the at least one of the semiconductor material region and the chip.

The integrated semiconductor circuit configuration according to the invention has a circuit device, a current/voltage supply line device for supplying the circuit device, and also a current measuring device for measuring the current consumption of the circuit device through the current/voltage supply line device. According to the invention, the circuit device, the current measuring device, and, also, at least part of the current/voltage supply line device are formed in a manner integrated in a common semiconductor material region or chip. According to the invention, the respective current measuring device, furthermore, has in each case at least one Hall sensor device.

Consequently, it is a first fundamental idea of the present invention to form the circuit device, the current measuring device, and, also, at least part of the current/voltage supply line device in a manner integrated in a common semiconductor substrate or chip. As a result, a particularly compact configuration is obtained.

It is a further fundamental idea of the present invention to form the individual current measuring device for the semiconductor circuit configurations with at least one Hall sensor device. As a result, it is possible to determine the consumption of electric current by the respective individual semiconductor device with direct influencing of the measurement being avoided or reduced to the greatest possible extent. Consequently, by the Hall sensor device, it is possible to determine an uncorrupted or less severely corrupted measurement result with regard to the electric current consumed by the individual semiconductor circuit configuration.

In an advantageous manner, in accordance with another feature of the invention, the respective Hall sensor device is configured for measuring an electric current flowing in the respective current/voltage supply line device by a magnetic field that can be generated by the current.

In principle, according to the invention, the Hall sensor device may be formed with an individual Hall sensor that is, then, configured for a specific measurement range with regard to the magnetic field impinging on it and, thus, with regard to the electric current flowing through the respective associated current/voltage supply line device.

Under certain circumstances, however, Hall sensors have a comparatively narrow measurement range. Therefore, it is particularly advantageous if a plurality of Hall sensors are provided, a plurality of at most partly overlapping measurement ranges being formed so that, as seen overall, the electric current flowing through an associated individual current/voltage supply line device can be detected particularly reliably across a wide range of values.

To further improve the measurement range characteristics and to improve the sensitivity of the respective Hall sensors, for the Hall sensor device or for each Hall sensor, provision is made of a magnetic field concentrating device that is configured to concentrate the magnetic field arising as a result of current flow in the associated current/voltage supply line device onto the Hall sensor device or onto the respective Hall sensor.

Such a configuration may be realized, for example, by a soft-magnetic material in each case being provided as the magnetic field concentrating device. The material may be, for example, ferrite or the like.

Furthermore, the magnetic field concentrating device substantially encloses the cross-section of the respective associated and individual current/voltage supply line device at at least one location. What is, thus, achieved is that a large part of the magnetic field lines generated by the current/voltage supply line device and, thus, the magnetic flux, cover the area formed by the enclosing by the magnetic field concentrating device.

Furthermore, for concentration purposes, the magnetic field concentrating device has a gap, and the Hall sensor device or the respective associated Hall sensor is disposed in the region of the gap.

Hall sensors can be used in direct magnetic field measurement operation, in which the magnetic field strength or magnetic flux density and the corresponding current flow are determined directly by the Hall voltage generated on account of the acting Lorenz forces. However, an indirect technique is appropriate precisely when a higher accuracy is to be achieved. The indirect technique may be carried out, for example, in the context of a so-called compensation method, and, then, the Hall sensor device is in each case configured as a compensation current converter or closed-loop Hall transducer. In such a case, an additional device in the Hall sensor device generates a magnetic field that compensates as exactly as possible for the flux density of the field that is actually to be measured at the location of the Hall sensor. Based upon a corresponding calibration, the current flow that is necessary for compensation can, then, be used, for example, as a measure of the magnetic field that is actually to be measured, and, thus, as a measure of the current that is actually to be measured in the associated individual current/voltage supply line device.

To such an end, preferably, a magnetic field compensation device is formed, in particular, in the region of the magnetic field concentrating device, and, further preferably, around the soft-magnetic material.

In accordance with a further feature of the invention, the magnetic field compensation device is a current line device in a region of the magnetic field concentrating device.

In accordance with an added feature of the invention, the Hall sensor device is formed in a semiconductor material, in particular, in silicon. Such a configuration results in a particularly undisturbed and direct application of an externally applied magnetic field to the Hall sensor device.

Furthermore, In accordance with an additional feature of the invention, there is provided a compensation device, which is configured to compensate for a voltage drop of the operating voltage VDD that occurs across the Hall sensor device during operation. As a result, a measurement can take place during the normal operation of the semiconductor circuit configuration without the operating parameters being critically influenced by the measurement process.

In accordance with yet another feature of the invention, the circuit configuration is configured for the external measurement of the Hall voltage of the Hall sensor device and, thus, for the external measurement of the current flowing through the current/voltage supply line device. Furthermore, in such a case, in particular, two output terminals are formed for tapping off the Hall voltage. After the tapping off of the Hall voltage or Hall voltages through the output terminals, the voltage or voltages can be processed further and evaluated externally.

In accordance with yet a further feature of the invention, there are provided a comparison voltage terminal receiving an externally fed in comparison voltage for the internal current measurement of the Hall voltage measurement, and a comparison device connected to the comparison voltage terminal and to the Hall sensor device for feeding in the comparison voltage of the comparison voltage terminal and the Hall voltage of the Hall sensor device, the comparison device comparing the Hall voltage with the comparison voltage.

As an alternative or in addition thereto, the integrated semiconductor circuit configuration is configured for the internal measurement of a Hall voltage of the Hall sensor device and, thus, for the internal measurement of the current flowing through the current/voltage supply line device.

In such a case, it is particularly advantageous if a comparison voltage terminal is formed for the internal current measurement or Hall voltage measurement, the terminal serving to receive a comparison voltage that can be fed or is fed externally. Furthermore, in such a case, a comparison device is formed, to which the comparison voltage of the comparison voltage terminal and also the Hall voltage of the Hall sensor device can be fed and that is configured to compare the Hall voltage with the comparison voltage. By such a comparison operation, it is, thus, possible to ascertain whether or not the Hall voltage of the Hall sensor that builds up internally corresponds to the comparison voltage that is fed externally, in which case conclusions can, then, be drawn about the actual value of the current flowing through the current/voltage supply line device.

In accordance with yet an added feature of the invention, in another advantageous development of the semiconductor circuit configuration integrated according to the invention, there is provided a register in which data or signals representative of the electric current flowing in the current/voltage supply line device can be stored in a manner such that they can be read out.

In such a case, in particular, at least one input/output terminal is formed, which is configured and provided for writing and/or reading access to the register. Such a measure results in a particularly direct and simple communication with the integrated semiconductor circuit configuration during a test that is performed.

These and further aspects of the present invention also emerge based upon the further explanations given below.

Test costs are acquiring an ever-greater significance in the fabrication of semiconductor circuits, e.g., of DRAMs. Therefore, new concepts are necessary to increase the parallelism during testing and to reduce the requirements made of the external tester in order to reduce the costs in this way. One approach in this direction is the so-called self-test (BIST=Built-In Self-test), in which the test is carried out by suitable additional circuits on the chip to be tested itself.

The method proposed according to the invention allows the supply current ICC to be measured on the chip itself. External measurement units are not necessary. The proposed method, thus, affords a solution to the previously existing problem that, although the logical functionality can be tested by a BIST, an external measurement unit is still necessary for the current measurements.

Hitherto, a so-called DC measurement unit has measured current externally. This necessitates a correspondingly equipped tester that requires a separate measuring unit and an individual supply voltage lead for each chip to be tested in the event of parallel testing. It is not possible, therefore, to utilize a common voltage supply for a plurality of chips tested in parallel, and this also increases the wiring outlay of the load board (PCB serving as interface between tester and module).

A method that can measure the consumption current on the chip is proposed. Advantages of a parallel on-chip measurement over the method—still being used—of external measurement by a current measurement unit are applicable:

It is possible to implement a consumption current on the chip without an external measurement unit;

During the test, it is possible to use a common voltage source for a plurality of chips tested in parallel; and Test times can be shortened because the current can be measured simultaneously on all the chips.

A further measurement method, namely, on-chip current measurement by a Hall probe, is proposed here. Further advantages include:

a simplified implementation on the chip;

an improved process independence of the current measurement; and a reduced influence of the circuit on the normal chip functionality.

A central idea lies in implementing a Hall probe on the chip for measuring the current consumption (ICC measurement).

The circuit for on-chip current measurement with the aid of a Hall probe is shown at the bottom of FIG. 1. The entire current that flows into the chip circuit through one or more supply voltage terminals (VDD pads) is conducted through a Hall structure. Such a structure is, preferably, embodied in the silicon because, here, the electron density is low and, consequently, the required magnetic field is small and the measurement signal is large.

A possible voltage drop across the Hall structure can be combated by correspondingly increasing the externally applied VDD. If the chip is provided internally with a regulated voltage network, then the measurement point for the voltage regulator should, advantageously, lie on the output side of the Hall probe so that possible voltage drops are automatically corrected.

To avoid the parasitic resistance of the Hall probe in normal operation, it may be advantageous to provide, for the measurement, a special VDD pad that is utilized exclusively during the current measurement for the application of the supply voltage. During the measurement, all the other VDD terminals can, then, be switched externally to high impedance, which, thus, also ensures that the entire current flows through the Hall probe. In practice, however, such a reduction of the VDD terminals means that the current can only be measured for operating states in which the current yield of this special test terminal is not exceeded.

The output pads P1 and P2 are the measurement terminals of the Hall structure. A magnetic field that is homogeneous across the wafer is applied externally. A Hall voltage proportional to the current through the probe can, thus, be measured at the terminals P1/P2:

$$U_H = \frac{ICC \cdot B}{n \cdot e \cdot d},$$

where:

n is the charge carrier concentration;

d is the layer thickness;

B is the magnetic field B;

ICC is the current; and $U_H$ is the Hall voltage.

Such a voltage measurement can also be effected on-chip. To that end, a comparison voltage is impressed externally. The comparison voltage is compared with the voltage at the measurement terminal by an on-chip differential amplifier. The externally impressed voltage is, then, stepped through over a specific measurement range. The externally applied voltage at which the differential amplifier detects a transition from 0 to 1 is stored on-chip. This is described below in FIG. 2. The comparison voltage is impressed at a pin Vin. The voltages of the measurement terminals are compared with the impressed voltage separately in the differential amplifiers. In the present example, the reference voltage currently applied externally to the chip is stored with the aid of an internal register that can be written to through a serial command pin SI. To be able to carry out the current measurement in parallel, the register is to be embodied such that the values input through SI are masked as soon as the internal Hall voltage corresponds to the external reference voltage. The value can, then, be read out at an arbitrary later point in time through the serial output SO. Because the register merely serves as a reference in order subsequently to determine individually for each chip the reference voltage at which the differential amplifier indicated correspondence with $U_H$, it is also possible, as an alternative, to use a counter that is incremented in the event of each reference voltage change Vin until the identity condition has been met. $U_H$ and ICC can, then, be determined by the voltage levels of Vin that are defined in the test program and are, therefore, known.

The voltage VDD is, possibly, impressed through more than one chip pad. For such a case, it is necessary, firstly, to provide a node through which the entire current ICC flows, which configuration can be realized by an additional pad. For the measurement, the VDD pads are isolated from the voltage supply. VDD is, then, impressed only through the measurement pad 2. For the measurement, VDD may also be impressed somewhat higher than in operation if the measurement circuit generates a significant voltage loss.

To ensure sufficient measurement accuracy, the measurement should be calibrated once at least for each batch (e.g., 25 wafers that have been processed together) using an analog current measurement.

A wafer containing many chips (DUTs=Device under Test) is exposed to a homogeneous magnetic field for measurement purposes.

Other features that are considered as characteristic for the invention are set forth in the appended claims.

Although the invention is illustrated and described herein as embodied in an integrated semiconductor circuit configuration, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Elements and components that have similar functions and structures are designated by the same reference symbols below without a detailed description being given or repeated each time they occur. The terms semiconductor circuit configuration 10 and semiconductor device 10 are used synonymously.

Figure 1:
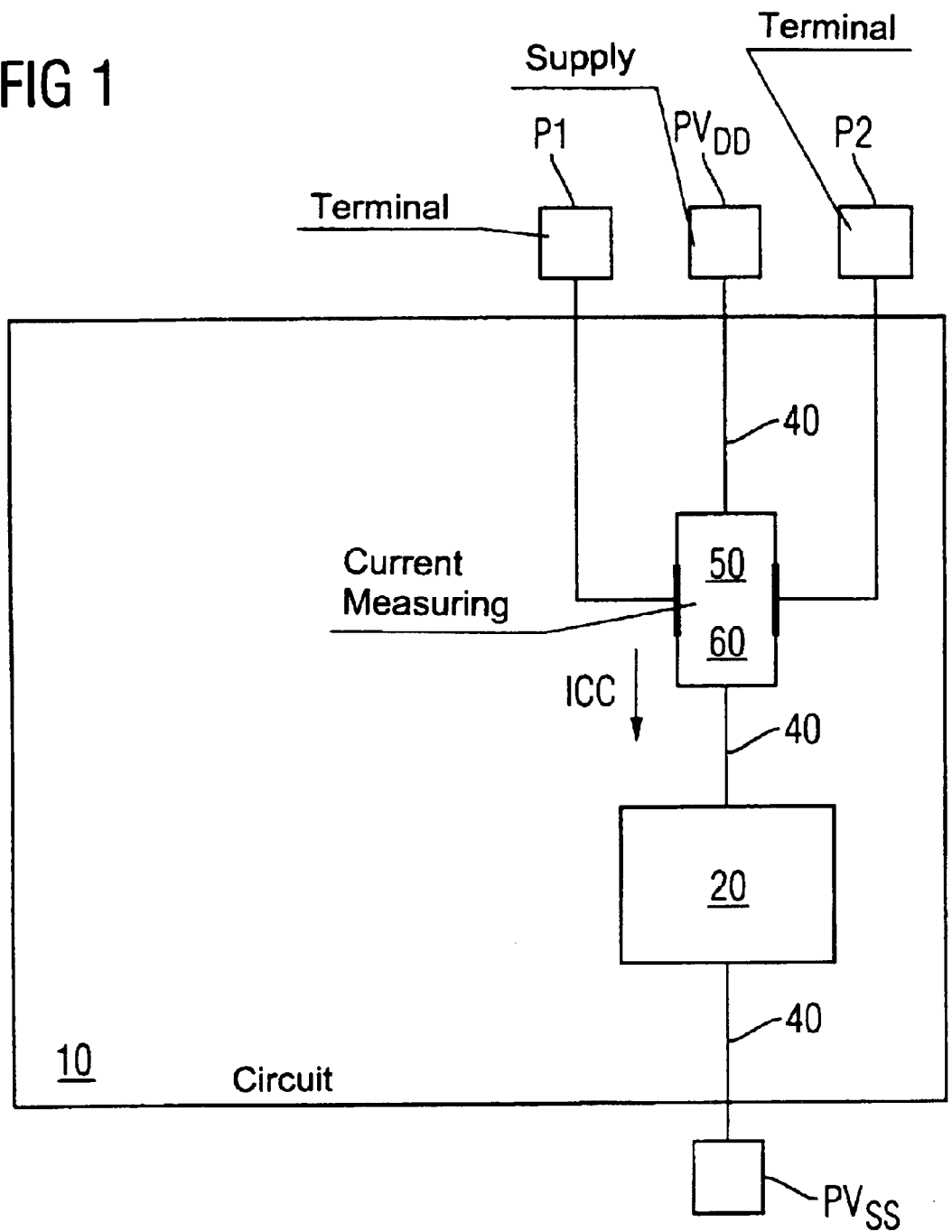
FIG. 1 is a block circuit diagram of a first preferred embodiment of a semiconductor circuit configuration according to the invention.

Referring now to the figures of the drawings in detail and first, particularly to FIG. 1 thereof, there is shown the basic construction of the semiconductor circuit configuration 10 according to the invention in the form of a schematic block diagram. The semiconductor circuit configuration 10 to be tested is disposed on a dedicated test board and connected in a controllable manner through non-illustrated bus systems to a configuration for testing the semiconductor circuit configuration 10. The semiconductor circuit configuration 10 has a circuit device 20. In such a case, the coupling to a common current/voltage supply unit takes place in a parallel manner through a main supply line leading to a supply terminal PVDD. To measure the current consumption of the semiconductor circuit configurations 10 to be tested during operation or during a test, provision is made of a current measuring device 50 in the form of a Hall sensor device 60 in the current/voltage supply line device 40. During operation, the configuration 10 is introduced into an external magnetic field B. The Hall voltage that arises transversely with respect to the current flow direction in the Hall sensor 60 can, then, be tapped off externally through terminals P1 and P2.

Figure 2:
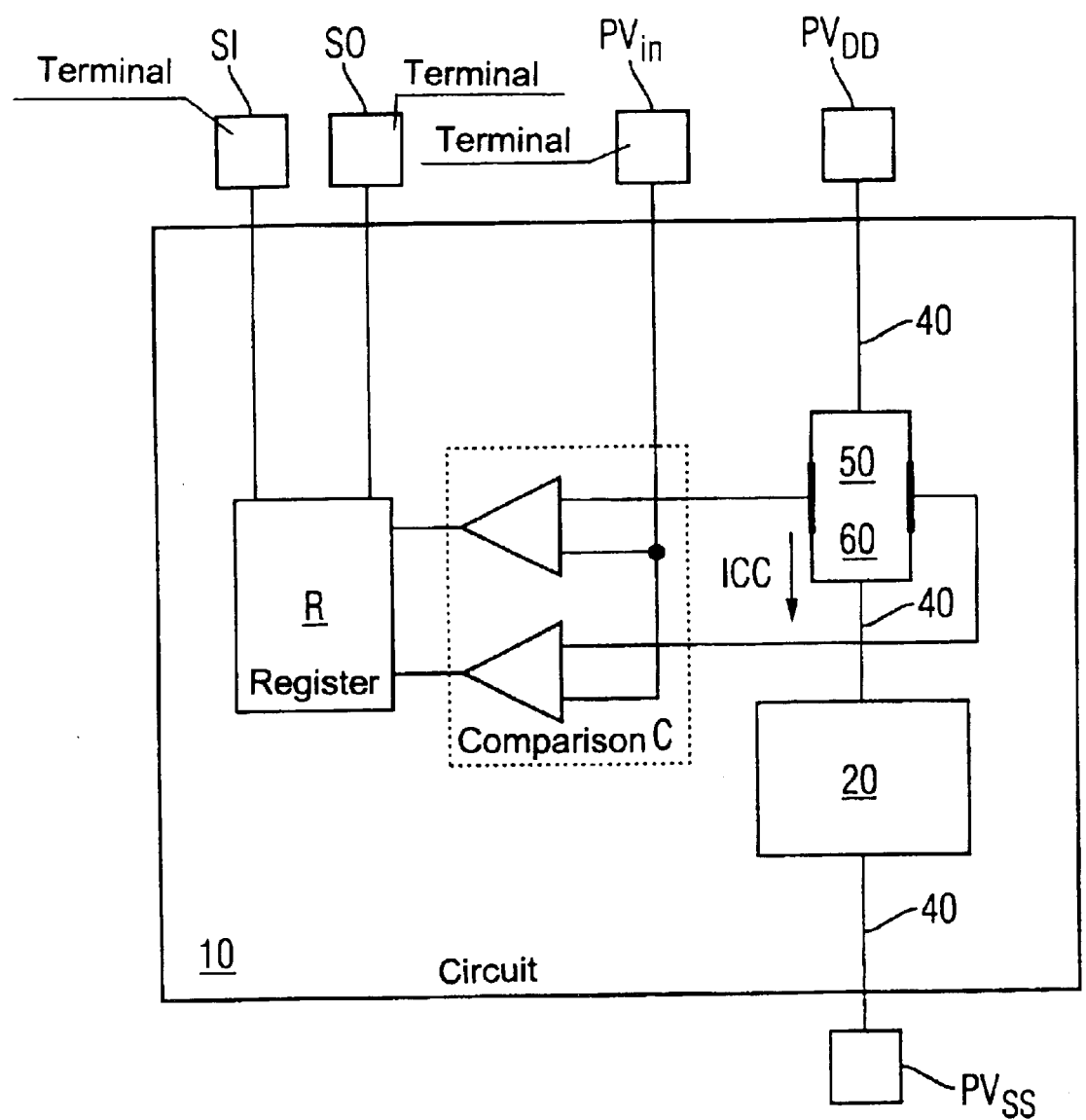
FIG. 2 is a block and schematic circuit diagram of a second preferred embodiment of a semiconductor circuit configuration according to the invention.

Whereas the current flowing through the current/voltage supply line device 40 is measured externally in the embodiment of FIG. 1, to be precise, by external tapping off of the Hall voltage at the terminal P1 and P2, FIG. 2 shows an embodiment in which an on-chip current measurement is effected.

The fundamental construction of the configuration of FIG. 2 is identical to that of FIG. 1 with the following differences: a comparison voltage Vin is applied to the integrated semiconductor circuit configuration 10 externally through a comparison voltage terminal PVin. Furthermore, the Hall voltage is not passed toward the outside through terminals, but, rather, is fed, together with the comparison voltage, to a comparison module C or a comparison device C provided in the integrated semiconductor circuit configuration. The comparison result thereof is fed to an internal register R, likewise provided in the semiconductor circuit configuration according to the invention, and stored there in order, then, to be read out subsequently through a serial output terminal SO. As seen overall, the communication is additionally also effected through a serial input terminal SI. During testing, i.e., during the measurement of the current that flows in the current/voltage supply line device 40, a range of comparison voltages in mosaic form can, thus, be applied, for example, through the comparison voltage terminal PVin. The respective value is, then, written to the internal register R through the serial input terminal SI. However, only that voltage value is stored in the internal register R for which the comparison device C exhibits a zero crossing with regard to its output signals, thereby resulting in the determination of the fact that the current comparison voltage that is, then, precisely present corresponds to the Hall voltage generated in the Hall sensor 60. The respective current flow in the current/voltage supply line device 40 can, then, be deduced by reading out the voltage value respectively stored in the register R through the serial output terminal SO.

We claim:

1. An integrated semiconductor circuit configuration, comprising:
   at least one of a semiconductor material region and a chip;
   a circuit device having a current consumption;
   a current/voltage supply line device connected to said circuit device;
   a current measuring device connected to said current/voltage supply line device for measuring the current consumption of said circuit device through said current/voltage supply line device, said current measuring device having at least one Hall sensor device; and
   said circuit device, said current measuring device, and at least part of said current/voltage supply line device being commonly integrated in said at least one of said semiconductor material region and said chip.

2. The integrated semiconductor circuit configuration according to claim 1, wherein said Hall sensor device measures an electric current flowing in a respective current/voltage supply line device through a magnetic field generated by the current.

3. The integrated semiconductor circuit configuration according to claim 1, wherein:
   said Hall sensor device has a plurality of Hall sensors sensing a plurality of at most partly overlapping measurement ranges; and
   one of said Hall sensors is for one measurement range.

4. The integrated semiconductor circuit configuration according to claim 3, wherein:
   at least one of said Hall sensor device and each of said Hall sensors has a magnetic field concentrating device concentrating a magnetic field arising as a result of current flow in said current/voltage supply line device onto said at least one of said Hall sensor device and said each of said Hall sensors.

5. The integrated semiconductor circuit configuration according to claim 4, wherein said magnetic field concentrating device has a soft-magnetic material.

6. The integrated semiconductor circuit configuration according to claim 4, wherein said magnetic field concentrating device substantially encloses a cross-section of a respective one of said current/voltage supply line devices at at least one location.

7. The integrated semiconductor circuit configuration according to claim 4, wherein:
   said magnetic field concentrating device has a gap; and
   said at least one of said Hall sensor device and a respective one of said Hall sensors is disposed in a region of said gap.

8. The integrated semiconductor circuit configuration according to claim 4, wherein said Hall sensor device is configured as one of a compensation current converter and a closed-loop Hall transducer.

9. The integrated semiconductor circuit configuration according to claim 8, further comprising a magnetic field compensation device.

10. The integrated semiconductor circuit configuration according to claim 9, wherein said magnetic field compensation device is a current line device in a region of said magnetic field concentrating device.

11. The integrated semiconductor circuit configuration according to claim 1, wherein said Hall sensor device is formed in a semiconductor material.

12. The integrated semiconductor circuit configuration according to claim 1, wherein said semiconductor material is silicon.

13. The integrated semiconductor circuit configuration according to claim 1, further comprising a compensation device adapted to compensate for a voltage drop of an operating voltage occurring across said Hall sensor device during operation.

14. The integrated semiconductor circuit configuration according to claim 1, further comprising two output terminals tapping off a Hall voltage of said Hall sensor device for externally measuring the Hall voltage and, thereby, externally measuring current flowing through said current/voltage supply line device.

15. The integrated semiconductor circuit configuration according to claim 1, wherein said current measuring device internally measures a Hall voltage of said Hall sensor device and, thereby, internally measures current flowing through said current/voltage supply line device.

16. The integrated semiconductor circuit configuration according to claim 15, further comprising:
   a comparison voltage terminal receiving an externally fed in comparison voltage for the internal current measurement of the Hall voltage measurement; and
   a comparison device connected to said comparison voltage terminal and to said Hall sensor device for feeding in the comparison voltage of said comparison voltage terminal and the Hall voltage of said Hall sensor device, said comparison device comparing the Hall voltage with the comparison voltage.

17. The integrated semiconductor circuit configuration according to claim 16, further comprising a register storing therein one of data and signals representative of the current flowing in said current/voltage supply line device, said register providing at least one of said data and signals for reading out therefrom.

18. The integrated semiconductor circuit configuration according to claim 1, further comprising a register storing therein one of data and signals representative of the current flowing in said current/voltage supply line device, said register providing at least one of said data and signals for reading out therefrom.

19. The integrated semiconductor circuit configuration according to claim 17, further comprising at least one input/output terminal connected to said register for at least one of writing to and reading from said register.

20. The integrated semiconductor circuit configuration according to claim 18, further comprising at least one input/output terminal connected to said register for at least one of writing to and reading from said register.

21. An integrated semiconductor circuit configuration, comprising:
   at least one of a semiconductor material region and a chip;
   a current/voltage supply line device having a current consumption;
   a current measuring device being connected to said current/voltage supply line device and having at least one Hall sensor device for measuring the current consumption through said current/voltage supply line device;
   a circuit device connected to said current/voltage supply line device and supplied at least one of current and voltage through said current/voltage supply line device, and
   said circuit device, said current measuring device and at least part of said current/voltage supply line device being commonly integrated in said at least one of said semiconductor material region and said chip.

* * * * *